(12) United States Patent
Hwang et al.

(10) Patent No.: US 8,513,635 B2
(45) Date of Patent: Aug. 20, 2013

(54) SWITCHING DEVICE AND MEMORY DEVICE INCLUDING THE SAME

(75) Inventors: Yun-Taek Hwang, Gyeonggi-do (KR); Jae-Yun Yi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 196 days.

(21) Appl. No.: 12/981,794

(22) Filed: Dec. 30, 2010

(65) Prior Publication Data

US 2012/0068137 A1    Mar. 22, 2012

(30) Foreign Application Priority Data

Sep. 17, 2010    (KR) .................. 10-2010-0091553

(51) Int. Cl.
*H01L 45/00* (2006.01)

(52) U.S. Cl.
USPC .................. 257/2; 257/E45.002

(58) Field of Classification Search
USPC ............................. 257/2, E45.002
See application file for complete search history.

(56) References Cited

U.S. PATENT DOCUMENTS

| 6,753,651 | B1 | 6/2004 | Goral | |
|---|---|---|---|---|
| 7,579,611 | B2 * | 8/2009 | Lam et al. | 257/2 |
| 2008/0296653 | A1 * | 12/2008 | Ozawa et al. | 257/316 |
| 2010/0008123 | A1 * | 1/2010 | Scheuerlein | 365/148 |

FOREIGN PATENT DOCUMENTS

| JP | 2000-0058831 | 2/2000 |
|---|---|---|
| JP | 2001-308286 | 11/2001 |
| KR | 1020050078394 | 8/2005 |
| KR | 1020070006930 | 1/2007 |

OTHER PUBLICATIONS

Notice of Allowance issued by the Korean Intellectual Property Office on Mar. 27, 2012.
Notice of Preliminary Rejection issued from Korean Intellectual Property Office on Aug. 26, 2011.

* cited by examiner

*Primary Examiner* — Calvin Lee
(74) *Attorney, Agent, or Firm* — IP & T Group LLP

(57) ABSTRACT

A switching device includes a first electrode, a bipolar tunneling layer, and a second electrode. The bipolar tunneling layer is formed on the first electrode and includes a plurality of dielectric layers having different dielectric constants. The second electrode is formed on the bipolar tunneling layer.

21 Claims, 5 Drawing Sheets

SWITCHING DEVICE AND MEMORY DEVICE INCLUDING THE SAME

CROSS-REFERENCE TO RELATED APPLICATIONS

The present application claims priority of Korean Patent Application No. 10-2010-0091553, filed on Sep. 17, 2010, which is incorporated herein by reference in its entirety.

BACKGROUND OF THE INVENTION

Exemplary embodiments of the present invention relate to semiconductor device fabrication technology, and more particularly, to a switching device for providing a bipolar (or bidirectional) current path and a memory device having the same.

In general, a unit cell of a semiconductor memory device has a 1S-1M structure that is a combination of a switching part and a memory part which stores data. For example, a resistive random access memory (ReRAM) device esteemed as the next-generation memory device includes a switching part using transistors or diodes and a memory part using a variable-resistance material such as a transition metal oxide.

Meanwhile, a semiconductor memory device uses a bipolar switching method in order to secure the desired characteristics with respect to an operating voltage, a leakage current, an operating speed, and durability. For example, a resistive memory device uses voltages of opposite polarities for a bipolar switching. According to the voltages of opposite polarities, a set operation where a memory part is changed from a high-resistance state to a low-resistance state is performed, and a reset operation where a memory part is changed from a low-resistance state to a high-resistance state is performed. In order to implement a bipolar switching mode of a semiconductor memory device, a switching part is to be configured to provide a bipolar current path.

In the conventional art, a diode is used as a switching part to provide a unipolar (or unidirectional) current path. The diode has a very low reverse current, thus making it difficult to implement stable bipolar switching characteristics. Also, a transistor may be used as a switching part to provide a bipolar current path. However, as the integration density of semiconductor memory devices increases, the size of a transistor which is difficult to be reduced may become a burden in a circuit design. A reduction in the transistor size may degrade the operational characteristics.

SUMMARY OF THE INVENTION

An embodiment of the present invention is directed to a switching device that provides a bipolar current path and is easy to be highly integrated.

Another embodiment of the present invention is directed to a semiconductor memory device that is used in a bipolar switching mode and is easy to be highly integrated.

In accordance with an exemplary embodiment of the present invention, a switching device includes: a first electrode; a bipolar tunneling layer formed on the first electrode and including a plurality of dielectric layers having different dielectric constants; and a second electrode formed on the bipolar tunneling layer.

In accordance with another exemplary embodiment of the present invention, a memory device includes: a plurality of conductive lines intersecting each other; and a memory cell formed between the conductive lines at the intersections of the conductive lines and having a switching unit and a memory unit connected in series to each other, wherein the switching unit includes a bipolar tunneling layer having a plurality of dielectric layers with different dielectric constants.

DESCRIPTION OF SPECIFIC EMBODIMENTS

Figure 1:
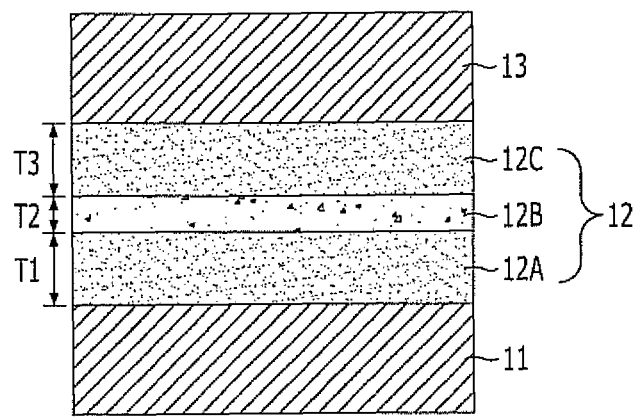
FIG. 1 is a cross-sectional view illustrating a switching device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention provides a switching device that uses a bipolar switching method and is easy to be highly integrated, and a semiconductor memory device having the same. To this end, the present invention provides a switching device that has a metal-insulator-metal (MIM) structure and provides a bipolar current path through direct tunneling or F-N tunneling, and a semiconductor memory device having the same.

FIG. 1 is a cross-sectional view illustrating a switching device in accordance with a first embodiment of the present invention.

Referring to FIG. 1, a switching device in accordance with a first embodiment of the present invention includes a first electrode 11, a bipolar tunneling layer 12 disposed on the first electrode 11 and including a plurality of dielectric layers having different dielectric constants, and a second electrode 13 disposed on the bipolar tunneling layer 12. The bipolar tunneling layer 12 may have a plurality of dielectric layers that have different dielectric constants and are sequentially stacked between the first electrode 11 and the second electrode 13. The number of the dielectric layers stacked may be controlled according to the electrical characteristics of the dielectric layers. Specifically, the switching device in accordance with the first embodiment of the present invention may have a sequential stack structure of a first dielectric layer 12A, a second dielectric layer 12B, and a third dielectric layer 12C.

The bipolar tunneling layer 12 provides a bidirectional current path by a bias voltage applied to the first and second electrode 11 and 13. In order to increase an on current (or an operating current) and reduce an off current (or a leakage current), the second dielectric layer 12B may have a higher dielectric constant than the first and third dielectric layers 12A and 12C. The first and third dielectric layers 12A and 12C having a relatively low dielectric constant increase an on current, and the second dielectric layer 12B having a relatively high dielectric constant reduces an off current. Also, the first and third dielectric layers 12A and 12C may be formed of the same material. This is to provide a uniform current path bidirectionally.

In terms of a band diagram regarding the bipolar tunneling layer 12 including the first to third dielectric layers 12A, 12B and 12C having different dielectric constants, the first and third dielectric layers 12A and 12C may have a larger band gap than the second dielectric layer 12B.

In order to more effectively increase an on current and reduce an off current, the second dielectric layer 12B may have a smaller thickness than the first and third dielectric layers 12A and 12C (T1, T3>T2). Here, the first and third dielectric layers 12A and 12C may have the same thickness (T1=T3). This is to provide a uniform current path bidirectionally.

The bipolar tunneling layer 12 provides a bipolar current path through direct tunneling or F-N tunneling. In order to more effectively increase an on current and reduce an off current, the difference between the work function of the first electrode 11 and the electron affinity of the first dielectric layer 12A and the difference between the work function of the second electrode 13 and the electron affinity of the third dielectric layer 12C may range from 0.1 eV to 3 eV. For reference, it is known that the current path by direct tunneling and F-N tunneling is affected by the electric potential barrier between an electrode and a dielectric layer.

The bipolar tunneling layer 12 may include a dielectric layer such as a silicon nitride layer ($Si_3N_4$), an aluminum oxide layer ($Al_2O_3$), a hafnium oxide layer ($HfO_2$), a zirconium oxide layer ($ZrO_2$), a titanium oxide layer ($TiO_2$), and a tantalum oxide layer ($Ta_2O_5$). In order to satisfy the above conditions, the first and third dielectric layers 12A and 12C may include at least one selected from the group consisting of a silicon nitride layer ($Si_3N_4$), an aluminum oxide layer ($Al_2O_3$), a hafnium oxide layer ($HfO_2$), and a zirconium oxide layer ($ZrO_2$), and the second dielectric layer 12B may include a titanium oxide layer ($TiO_2$) or a tantalum oxide layer ($Ta_2O_5$).

The first and second electrodes 11 and 13 may include a metallic layer. For example, the first and second electrodes 11 and 13 may include one selected from the group consisting of titanium (Ti), platinum (Pt), aurum (Au), ruthenium (Ru), iridium (Ir), argentum (Ag), aluminum (Al), nickel (Ni), chrome (Cr), palladium (Pd), tungsten (W), and any alloy thereof.

As described above, the switching device in accordance with the first embodiment of the present invention is easy to be highly integrated because it provides a bipolar current path and has a simple MIM structure. Also, the bipolar tunneling layer has a stack structure of a plurality of dielectric layers having different dielectric constants, thereby to increase an on current and reduce an off current.

Hereinafter, the effects and the operational characteristics of the switching device in accordance with the first embodiment of the present invention will be described in detail with reference to FIG. 2.

Figure 2:
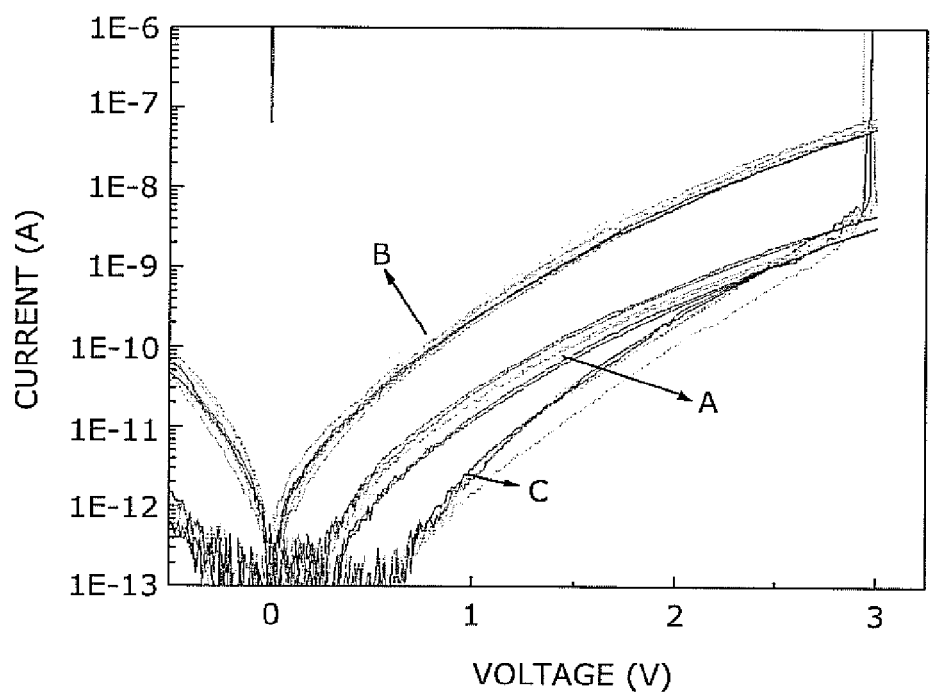
FIG. 2 is a current-voltage (I-V) graph illustrating the operational characteristics of a switching device formed in accordance with a first embodiment of the present invention.

FIG. 2 is a current-voltage (I-V) graph illustrating the operational characteristics of a switching device formed in accordance with a first embodiment of the present invention.

A graph denoted by a reference 'A' of FIG. 2 represents the case where the bipolar tunneling layer has a sequential stack structure of a zirconium oxide layer (20 Å)/a titanium oxide layer (10 Å)/a zirconium oxide layer (20 Å), and a graph denoted by a reference 'B' represents the case where the bipolar tunneling layer has a sequential stack structure of a zirconium oxide layer (14 Å)/a titanium oxide layer (7 Å)/a zirconium oxide layer (14 Å). A graph denoted by a reference 'C' represents the case where the bipolar tunneling layer has a single zirconium oxide layer (30 Å) as a comparative example.

Referring to FIG. 2, it can be seen that, if the bipolar tunneling layers have similar thicknesses, the bipolar tunneling layer including stacked layers (i.e., the case 'B') can improve/increase an on current as compared to the bipolar tunneling layer including a single layer (i.e., the comparative example 'C').

Also, it can be seen that, even though the bipolar tunneling layer of stacked layers is thicker than the bipolar tunneling layer of a single layer, the bipolar tunneling layer of stacked layers (i.e., the case 'A') can provide a similar on current to the bipolar tunneling layer of a single layer (i.e., the comparative example 'C'). This reveals that the case where the bipolar tunneling layer includes stacked layers can more effectively increase an on current than the case where the bipolar tunneling layer includes a signal layer.

In a general MIM structure, the on current and the off current may be decreased with an increase in the thickness of a dielectric layer. That is, the thickness of a dielectric layer is to be increased in order to decrease the off current, but there is a trade off relationship between the off current and the on current. The on current is decreased with an increase in the thickness of a dielectric layer. However, it can be seen that the present invention does not decrease the on current even when increasing the thickness of the bipolar tunneling layer (i.e., the dielectric layer) in order to decrease the off current.

Figure 3:
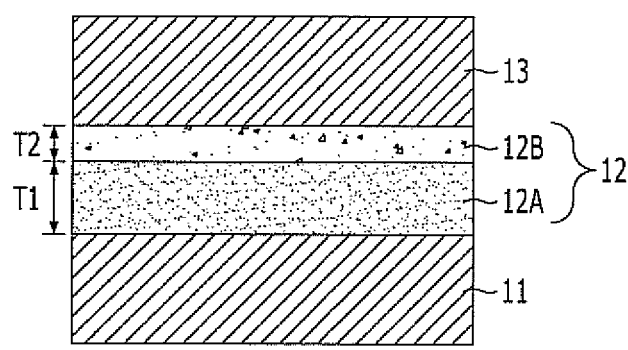
FIG. 3 is a cross-sectional view illustrating a switching device in accordance with a second embodiment of the present invention.

FIG. 3 is a cross-sectional view illustrating a switching device in accordance with a second embodiment of the present invention.

Hereinafter, for illustration purposes, like reference numerals are used to denote like elements through the first and second embodiments of the present invention.

Referring to FIG. 3, a switching device in accordance with a second embodiment of the present invention includes a first electrode 11, a bipolar tunneling layer 12 disposed on the first electrode 11 and including a plurality of dielectric layers having different dielectric constants, and a second electrode 13 disposed on the bipolar tunneling layer 12. The bipolar tunneling layer 12 in accordance with the second embodiment of the present invention may have a sequential stack structure of a first dielectric layer 12A and a second dielectric layer 12B. Here, the second dielectric layer 12B may have a higher dielectric constant than the first dielectric layer 12A.

The bipolar tunneling layer 12 provides a bidirectional current path by a bias voltage applied to the first and second electrode 11 and 13. If the second dielectric layer 12B has a higher dielectric constant than the first dielectric layer 12A, the first dielectric layer 12A increases the on current and the second dielectric layer 12B decreases the off current.

In terms of a band diagram regarding the bipolar tunneling layer 12 including the first and second dielectric layers 12A and 12B having different dielectric constants, the first dielectric layer 12A may have a larger band gap than the second dielectric layer 12B.

In order to more effectively increase an on current and reduce an off current, the first dielectric layer 12A and the second dielectric layer 12B may have different thicknesses. For example, if the second dielectric layer 12B has a higher dielectric constant than the first dielectric layer 12A, the second dielectric layer 12B may have a smaller thickness than the first dielectric layer 12A (T1>T2).

The bipolar tunneling layer 12 provides a bipolar current path through direct tunneling or F-N tunneling. In order to more effectively increase an on current and reduce an off current, the difference between the work function of the first electrode 11 and the electron affinity of the first dielectric layer 12A may range from 0.1 eV to 3 eV. For reference, it is known that the current path by direct tunneling and F-N tunneling is affected by the electric potential barrier between an electrode and a dielectric layer.

The bipolar tunneling layer 12 may include a dielectric layer such as a silicon nitride layer ($Si_3N_4$), an aluminum oxide layer ($Al_2O_3$), a hafnium oxide layer ($HfO_2$), a zirconium oxide layer ($ZrO_2$), a titanium oxide layer ($TiO_2$), and a tantalum oxide layer ($Ta_2O_5$). In order to satisfy the above conditions, the first dielectric layer 12A may include at least one selected from the group consisting of a silicon nitride layer ($Si_3N_4$), an aluminum oxide layer ($Al_2O_3$), a hafnium oxide layer ($HfO_2$), and a zirconium oxide layer ($ZrO_2$), and the second dielectric layer 12B may include a titanium oxide layer ($TiO_2$) or a tantalum oxide layer ($Ta_2O_5$).

The first and second electrodes 11 and 13 may include a metallic layer. For example, the first and second electrodes 11 and 13 may include one selected from the group consisting of titanium (Ti), platinum (Pt), aurum (Au), ruthenium (Ru), iridium (Ir), argentum (Ag), aluminum (Al), nickel (Ni), chrome (Cr), palladium (Pd), tungsten (W), and any alloy thereof.

As described above, the switching device in accordance with the second embodiment of the present invention is easy to by highly integrated because it provides a bipolar current path and has a simple MIM structure. Also, the bipolar tunneling layer has a stack structure of a plurality of dielectric layers having different dielectric constants, thereby to increase an on current and reduce an off current.

Also, the switching device in accordance with the second embodiment of the present invention may reduce the thickness of the switching device while implementing the same operational characteristics as those of the switching device in accordance with the first embodiment of the present invention.

Figure 4A:
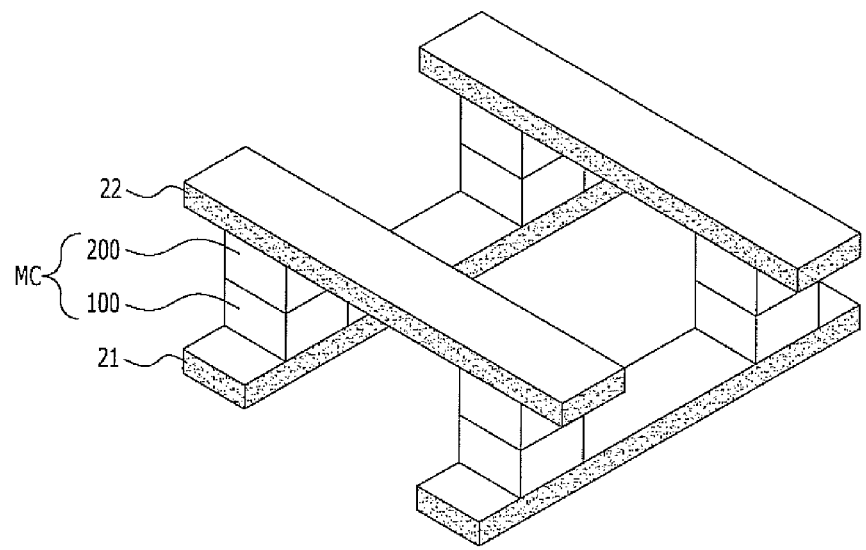
FIGS. 4A to 4D are views illustrating a memory device having a switching device in accordance with an exemplary embodiment of the present invention.
Figure 4B:
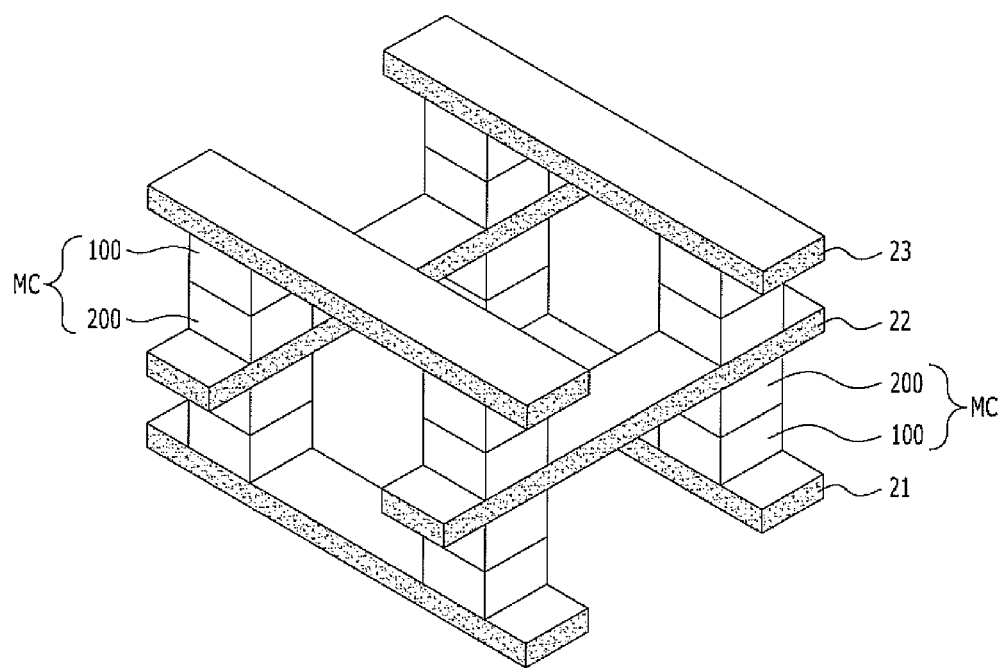
Figure 4C:
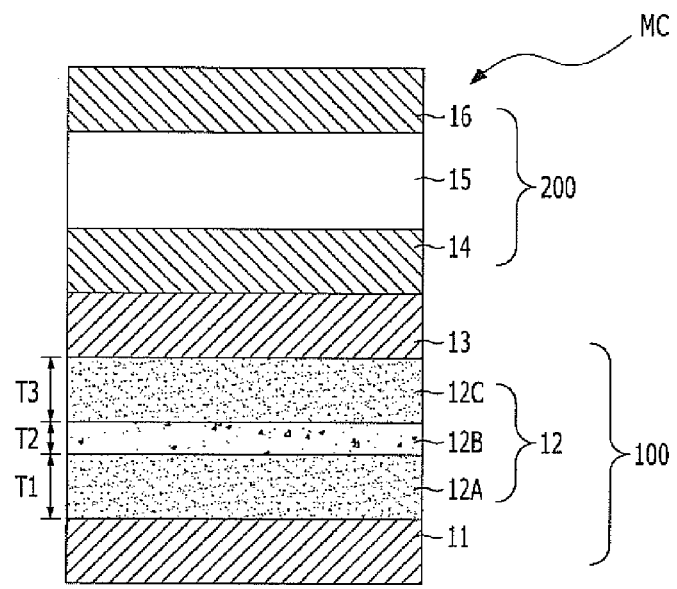
Figure 4D:
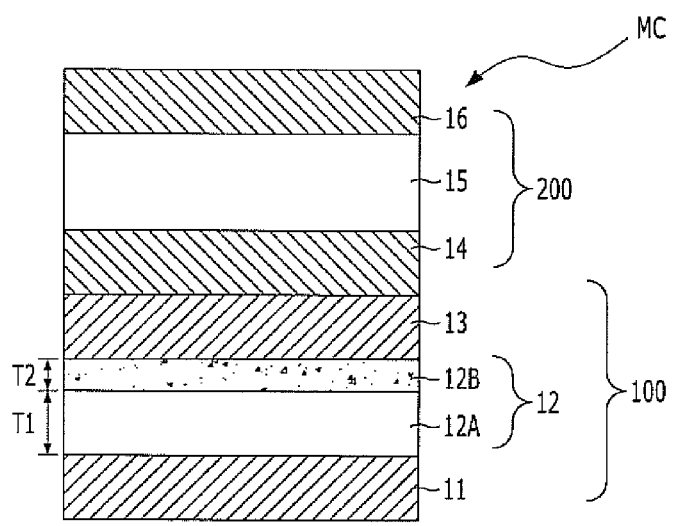

FIGS. 4A to 4D are views illustrating a memory device having a switching device in accordance with an exemplary embodiment of the present invention. FIG. 4A is a perspective view illustrating a memory device having a crossbar array structure. FIG. 4B is a perspective view illustrating a memory device having a three-dimensional crossbar array structure. FIG. 4C is a cross-sectional view illustrating a memory cell MC having a switching device in accordance with a first embodiment of the present invention. FIG. 4D is a cross-sectional view illustrating a memory cell MC having a switching device in accordance with a second embodiment of the present invention.

Referring to FIGS. 4A to 4D, a memory device in accordance with an exemplary embodiment of the present invention includes a plurality of conductive lines 21, 22, and 23 intersecting each other, and memory cells MC disposed between the conductive lines at the intersections of the conductive lines.

The memory cell MC has a switching unit 100 and a memory unit 200 that are sequentially stacked and are connected in series to each other. In one memory cell MC, there is no restriction on the connection order of the switching unit 100 and the memory unit 200 (the switching unit/the memory unit or the memory unit/the switching unit). The switching unit 100 includes a first electrode 11, a bipolar tunneling layer 12 disposed on the first electrode 11 and including a plurality of dielectric layers having different dielectric constants, and a second electrode 13 disposed on the bipolar tunneling layer 12. The switching unit 100 has been described above with reference to FIGS. 1 to 3, and thus a detailed description thereof is omitted for conciseness.

If the conductive lines include a first conductive line 21 and a second conductive line 22 (see FIG. 4A), a memory cell MC having a switching unit 100 and a memory unit 200 connected in series to each other may be disposed at the interconnection of the first conductive line 21 and the second conductive line 22.

Also, if the conductive lines include first to third conductive lines 21, 22, and 23 (see FIG. 4B), a memory cell MC may be disposed symmetrically with respect to the second conductive line 22 between the first conductive line 21 and the third conductive line 23. That is, the memory unit 200 of each memory cell MC may be connected to the second conductive line 22, and the switching unit 100 of each memory cell MC may be connected to the first conductive line 21 and the third conductive line 23.

The memory unit 200 includes a third electrode 14 connected to the switching unit 100, a variable resistance layer 15 connected to the third electrode 14, and a fourth electrode 16 connected to the variable resistance layer 15, which are sequentially stacked. The memory unit 200 includes a material having a resistance that varies according to voltage or current applied to the third electrode 14 and the fourth electrode 16. Specifically, the variable resistance layer 15 of the memory unit 200 may include a material having a resistance that varies according to voltage or current applied to the third electrode 14 and the fourth electrode 16. More specifically, the variable resistance layer 15 may include: a phase-change material layer including a chalcogenide compound; a variable resistance material layer including a perovskite material or a transitional metal oxide or a chalcogenide material.

In the memory cell MC, the second electrode 13 of the switching unit 100 and the third electrode 14 of the memory unit 200 may replace each other. That is, one of the second and third electrodes 13 and 14 may not be formed.

The memory device of the present invention has the switching unit 100 providing a bipolar current path and having a simple MIM structure, thereby implementing a highly-integrated memory device while securing stable operational characteristics by using a bipolar switching method.

Also, the bipolar tunneling layer 12 of the switching unit 100 has a stack structure of a plurality of dielectric layers with different dielectric constants, thereby to increase an on current and reduce an off current. Accordingly, the appropriate operational characteristics of the memory device may be obtained.

As described above, the switching device of the present invention is easy to be highly integrated because it provides a bipolar current path and has a simple MIM structure.

Also, the switching device of the present invention has the bipolar tunneling layer having a stack structure of a plurality of dielectric layers with different dielectric constants, thereby to increase an on current and reduce an off current.

While the present invention has been described with respect to the specific embodiments, it will be apparent to those skilled in the art that various changes and modifications may be made without departing from the spirit and scope of the invention as defined in the following claims.

What is claimed is:

1. A switching device comprising:
   a first electrode;
   a bipolar tunneling layer formed on the first electrode and comprising a plurality of dielectric layers having different dielectric constants; and
   a second electrode formed on the bipolar tunneling layer,
   wherein the plurality of dielectric layers comprise a first dielectric layer, a second dielectric layer, and a third dielectric layer that are stacked sequentially, and the plurality of dielectric layers provide a bidirectional current path,
   wherein a difference between a work function of the first electrode and an electron affinity of the first dielectric layer ranges from 0.1 eV to 3 eV.

2. The switching device of claim 1, wherein the second dielectric layer has a higher dielectric constant than the first dielectric layer and the third dielectric layer.

3. The switching device of claim 1, wherein the first dielectric layer and the third dielectric layer are formed of the same material.

4. The switching device of claim 1, wherein the first dielectric layer and the third dielectric layer each have a greater thickness than the second dielectric layer.

5. The switching device of claim 1, wherein the first dielectric layer, the second dielectric layer and the third dielectric layer comprise at least one selected from the group consisting of an aluminum oxide layer, a silicon nitride layer, a hafnium oxide layer, a zirconium oxide layer, a titanium oxide layer, and a tantalum oxide layer.

6. The switching device of claim 1, wherein the first dielectric layer and the third dielectric layer each comprise at least one selected from the group consisting of the aluminum oxide layer, the silicon nitride layer, the hafnium oxide layer, and the zirconium oxide layer, and the second dielectric layer comprises the titanium oxide layer or and the tantalum oxide layer.

7. A switching device comprising:
   a first electrode;
   a bipolar tunneling layer formed on the first electrode and comprising a plurality of dielectric layers having different dielectric constants; and
   a second electrode formed on the bipolar tunneling layer,
   wherein the plurality of dielectric layers comprise a first dielectric layer and a second dielectric layer that are stacked sequentially, and when the second dielectric layer has a higher dielectric constant than the first dielectric layer, the second dielectric layer has a smaller thickness than the first dielectric layer,
   wherein a difference between a work function of the first electrode and an electron affinity of the first dielectric layer ranges from 0.1 eV to 3 eV.

8. The switching device of claim 7, wherein the first dielectric layer and the second dielectric layer comprise at least one selected from the group consisting of an aluminum oxide layer, a silicon nitride layer, a hafnium oxide layer, a zirconium oxide layer, a titanium oxide layer, and a tantalum oxide layer.

9. A memory device comprising:
   a plurality of conductive lines intersecting each other; and
   a memory cell formed between the conductive lines at the intersections of the conductive lines and having a switching unit and a memory unit connected in series to each other,
   wherein the switching unit comprises a bipolar tunneling layer having a plurality of dielectric layers with different dielectric constants,
   wherein the plurality of dielectric layers comprise a first dielectric layer, a second dielectric layer, and a third dielectric layer that are stacked sequentially, and the plurality of dielectric layers provide a bidirectional current path.

10. The memory device of claim 9, wherein the switching unit further comprises first and second electrodes between which the bipolar tunneling layer is interposed.

11. The memory device of claim 10, wherein the memory unit comprises:
    a third electrode connected to one of the first and second electrodes of the switching unit;
    a variable resistance layer connected to the third electrode; and
    a fourth electrode connected to the variable resistance layer.

12. The memory device of claim 11, wherein the said one and the third electrode are formed of the same material to replace each other.

13. The memory device of claim 11, wherein the memory unit comprises a material having a resistance that varies according to voltage or current applied to the third electrode and the fourth electrode.

14. The memory device of claim 11, wherein the variable resistance layer comprises a phase-change material layer or a variable resistance material layer.

15. The memory device of claim 9, wherein the second dielectric layer has a higher dielectric constant than the first dielectric layer and the third dielectric layer.

16. The memory device of claim 9, wherein the first dielectric layer and the third dielectric layer are formed of the same material.

17. The memory device of claim 9, wherein the first dielectric layer and the third dielectric layer have a greater thickness than the second dielectric layer.

18. The memory device of claim 9, wherein the first dielectric layer and the third dielectric layer comprise at least one selected from the group consisting of an aluminum oxide layer, a silicon nitride layer, a hafnium oxide layer, and a zirconium oxide layer, and the second dielectric layer comprises a titanium oxide layer or and a tantalum oxide layer.

19. The memory device of claim 9, wherein a difference between a work function of the first electrode and an electron affinity of the first dielectric layer ranges from 0.1 eV to 3 eV.

20. A memory device comprising:
    a plurality of conductive lines intersecting each other; and
    a memory cell formed between the conductive lines at the intersections of the conductive lines and having a switching unit and a memory unit connected in series to each other,
    wherein the switching unit comprises a bipolar tunneling layer having a plurality of dielectric layers with different dielectric constants,
    wherein the plurality of dielectric layers comprise a first dielectric layer and a second dielectric layer that are stacked sequentially, and when the second dielectric layer has a higher dielectric constant than the first dielectric layer, the second dielectric layer has a smaller thickness than the first dielectric layer.

21. The switching device of claim 20, wherein a difference between a work function of the first electrode and an electron affinity of the first dielectric layer ranges from 0.1 eV to 3 eV.

* * * * *